United States Patent [19]

Ash

[11] Patent Number: 5,357,206

[45] Date of Patent: Oct. 18, 1994

[54] SEQUENTIAL AMPLIFIER

[75] Inventor: Darrell L. Ash, Sachse, Tex.

[73] Assignee: R.F. Monolithics, Inc., Dallas, Tex.

[21] Appl. No.: 8,522

[22] Filed: Jan. 21, 1993

[51] Int. Cl.⁵ ............................................. H03F 1/14
[52] U.S. Cl. ..................................... 330/51; 330/310
[58] Field of Search ................. 330/9, 51, 107, 310,
330/306, 149, 150; 455/290, 293, 341

[56] References Cited

U.S. PATENT DOCUMENTS

| | | | |
|---|---|---|---|
| 3,113,268 | 12/1963 | Horak | 330/150 |
| 3,921,085 | 11/1975 | Keane | 329/110 |
| 4,952,832 | 8/1990 | Imai | 310/313 R |
| 4,954,795 | 9/1990 | Choi | 310/313 R |
| 5,099,204 | 3/1992 | Wheatley, III | 330/310 |
| 5,175,871 | 12/1992 | Kunkel | 330/51 |

FOREIGN PATENT DOCUMENTS 0354587  2/1990  European Pat. Off. .............. 330/51

Primary Examiner—Steven Mottola
Assistant Examiner—Teep H. Nguyen
Attorney, Agent, or Firm—Jones, Day, Reavis & Pogue

[57] ABSTRACT

A sequential amplifier having at least two amplifier stages separated by a delay device such that a clock may control both stages to energize one while the other is de-energized, thus allowing a signal to be amplified by adjacent amplifier stages without the adverse effects of feedback associated therewith.

9 Claims, 3 Drawing Sheets

SEQUENTIAL AMPLIFIER

BACKGROUND OF THE INVENTION

1. Field of the Invention

This invention relates to amplifiers in general and more particularly to amplifiers for use with weak signals for radio frequency (RF) and audio frequency applications. The invention is ideally suited for use in radio and television receivers. However, it will be appreciated that the invention can be used in any electronic device where weak signals are to be amplified and signal gain is to be increased.

2. Description of the Prior Art

Radio receivers have been in existence for almost a century. The earliest receivers were extremely crude in design and consisted of no more than a crystal receiver with a simple diode connected to a pair of headphones. The diode and headphone combination acted as a detector/low pass filter wherein an RF signal generated by the crystal was detected by the diode and the low frequency aspect was passed by the headphones while the higher frequency carrier was blocked. These circuits included a so-called "cat's whisker" wherein a wire comprising the cat's whisker would be placed against various spots in the crystal detector. The process of moving the cat's whisker from one location to another was a crude form of station tuning whereby the frequency at which the crystal was oscillating was essentially shifted slightly thereby causing the crystal to act as a detector/demodulator for that given frequency. Thus, the signal was effectively demodulated and the audio portion could be heard in the headphones.

This crystal detector type of radiossuffered from many disadvantages. Among those were a lack of sensitivity, poor station selection and low power. The low output power was witnessed by the fact that only a few stations could be detected by the radio.

To overcome these disadvantages, tuned radio frequency (TRF) receivers were developed. TRF receivers gave improved selectivity, sensitivity and output power by adding radio frequency and audio frequency amplifier stages. The purpose of TRF receivers was essentially to enhance signal gain and the result was that more stations could be detected and heard over speakers as well as with headphones.

A significant problem with this type of receiver was distortion. This distortion resulted from the occurrence of positive feedback between amplifier stages. The distortion problem was particularly acute at higher frequencies. Higher frequencies were more difficult for the receiver to process due to the fact that the various leads comprising the receiver signal processing stages would act as "mini antennae" radiating the signal into all parts of the receiver and thereby introducing feedback and unwanted distortion into the circuit.

In addition, physical coupling (conduction) of the RF signals from one stage to another occur. For example, the common power supply bus requires filtering devices between stages to attempt to reduce the coupling of the RF signals from one stage to another through the power supply distribution bus line. Therefore, as used herein, the term "radiating", or its equivalent, is intended to include "conduction" of the signal by a physical coupling such as a common power supply bus.

The next major advancement was the superheterodyne receiver. The superheterodyne has many important advantages over the above receiver types. The main distinction between the superheterodyne and the earlier versions of radio receivers is that the superheterodyne will amplify an RF signal in at least two different stages before it reaches the audio amplifier. The method with which this occurs represents a major improvement over previous designs. In a superheterodyne there are a minimum of two amplifier stages. A first stage includes an RF amplifier for providing gain to the weak radio frequency signals received from the antenna. A mixer stage, or single conversion stage, mixes the amplified RF signal with an oscillator signal. These two signals are designed to differ by a specified frequency. The resultant output of the first detector stage is called the intermediate frequency ("IF") and represents the difference between the oscillator frequency and the RF frequency. This intermediate frequency is then fed through an IF amplifier and a detector wherein the high frequency component is eliminated and the remaining audio signal is then fed to an audio amplifier. The purpose for using an IF stage is to reduce the RF frequency in the first stage to a second frequency different from the RF frequency so that radiation from the RF circuit would not adversely influence or be coupled to the IF stage during amplification in the IF stage. In addition, amplification in the IF stage would not affect the RF stage. Thus the superheterodyne receiver allowed more amplification and gain in the receiver since the two stages, operating at different frequencies, did not adversely influence each other.

The problem of feedback and oscillation continues to exist when amplifier stages operating at the same frequency are in the vicinity of each other. This is, again, due to signal radiation from one amplifier stage to another. This places a severe limitation on the abilities of amplifiers to increase the output power of a signal. The problem is even more pronounced at higher frequencies where individual portions of the circuit, such as connection terminals, will act as antennae thus feeding the output signals back into the input portions.

SUMMARY OF THE INVENTION

The present invention circuit overcomes the above-stated disadvantages of the prior art. In the broadest application, the invention consists of a minimum of two amplifier stages separated by a signal delay device. In addition, each amplifier stage is controlled by a switching unit. Essentially, a signal will be received by the first amplifier stage and the amplifier is energized by the switching unit. The second amplifier stage is de-energized such that the second amplifier will not be operating during the time the first amplifier is in operation. Thus there will be no detrimental signal feedback, either by radiation or conduction, coupled between the first and second amplifier stages. The signal from the first RF amplifier will pass through the delay device and into the second stage amplifier. Prior to or at least at the time the signal emerges from the delay line, as the signal reaches the second stage amplifier, the second amplifier will be energized and the first amplifier will be de-energized. In the second stage amplifier, the signal will again be amplified. The first stage amplifier will be switched OFF when the second stage amplifier is switched ON and vice versa. The function of the delay device is to ensure that when the amplifier stage receiving the signal is energized, the other stage is de-energized and it will not have an output that could feedback into and cause distortion in the first amplifier stage.

The delay circuit will slow the signal's travel between stages 1 and 2. The amount of delay may be selected for a particular frequency or operation. The limiting factor always is that amplifier stage 1 and amplifier stage 2 must not be energized simultaneously.

It is, therefore, the principal object of this invention to provide increased amplification and stable gain of a circuit for all audio and radio frequencies.

It is another object of the invention to provide improved amplification and stable gain for electronic circuits at a given frequency without the frequency radiation or conduction from any one stage adversely affecting another stage.

It is still a further object of the invention to provide an amplifier of high frequency radio signals wherein one or more stages of stable amplification at the same signal frequency can be used without one stage radiating or conductions the amplified signal to another stage to cause instability oscillation and distortion.

It is yet another object of the present invention to provide an amplifier of a given signal frequency in at least two stages wherein when one stage is energized, the at least one other stage is de-energized to prevent instability such that frequency radiation from the one stage is not coupled to the at least one other stage and signal feedback is avoided.

BRIEF DESCRIPTION OF THE DRAWINGS

These and other objects of the present invention will be more fully understood in conjunction with the accompanying drawings in which like numbers indicate like components and in which.

DESCRIPTION OF THE PREFERRED EMBODIMENT

Figure 1:
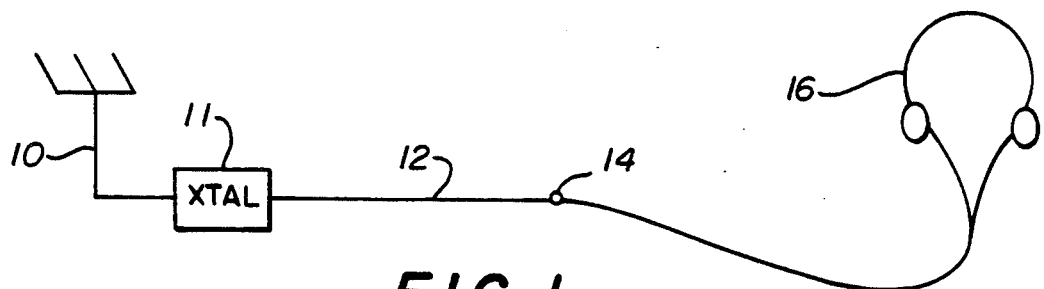
FIG. 1 is a diagram of a prior art basic diode detector radio receiver.

FIG. 1 is a generalized diagram of the basic prior art crystal detector radio receiver. The circuit includes some type of an antenna 10 feeding an RF signal into a crystal 11 that served as the bandpass filter, could select a station and generate an audio signal on a "cat whisker" 12 to a terminal 14. A pair of headphones 16 coupled to the terminal 14 would detect the audio signal by decoupling the radio frequency signals and allowing the audio modulation envelope to be heard. These sets were known as crystal sets.

Figure 2:
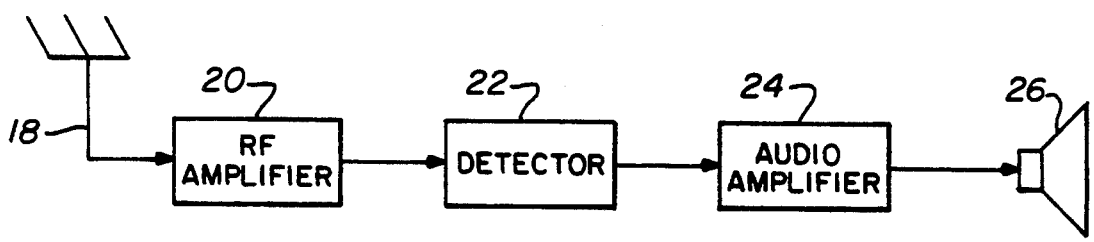
FIG. 2 is a block diagram of a prior art tuned radio frequency (TRF) receiver.

As the systems improved, the circuit of FIG. 2 came into being. An RF amplifier 20 was placed after the antenna 18 and before a detector 22. The output of the detector 22 was coupled to an audio amplifier 24 where gain was added to the signal and the signal then drove an audio output device such as headphones or a speaker 26. Of course the signals were weak and, even with the RF amplifier and the audio amplifier, there was still a great difficulty in amplifying the weak signals sufficiently that they could be heard. When more RF amplifier stages 20 were added in the RF section, the RF frequencies caused each part of the RF amplifier to become a small signal radiator or antenna that radiated the RF frequency to all other parts of the RF amplifier section. If two or more RF amplifier stages were added in the RF section, the output of the second amplifier was simply radiated back to the first amplifier as the gain increased and eventually the stages simply oscillated. Thus, there is a limit to the amount of amplification that could be obtained in the RF section. At first cables were shielded and circuits were enclosed in metal boxes to prevent the radiation from adversely influencing other parts of the RF circuit. As the frequencies increased and the circuit size decreased, radiation from one stage to the other became even more pronounced.

Figure 3:
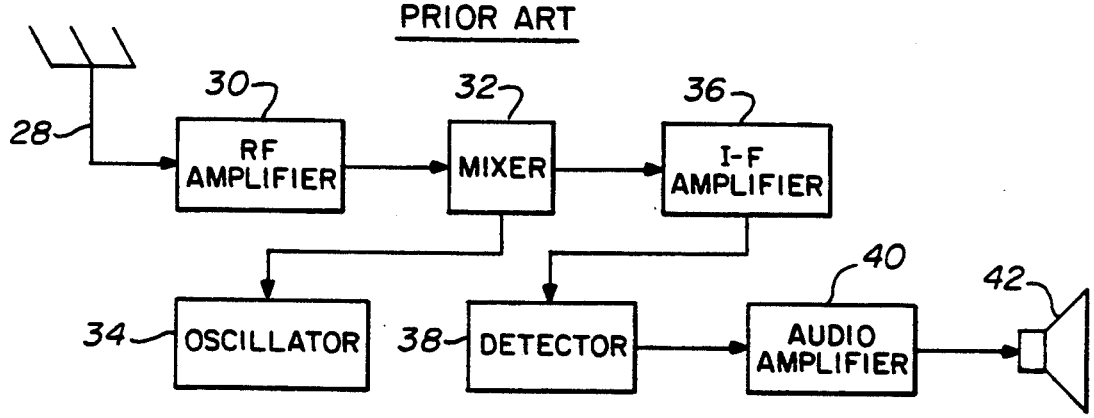
FIG. 3 is a block diagram of a prior art superheterodyne receiver.

Thus, the superheterodyne receiver similar to that shown in FIG. 3 was introduced. The signal from the antenna 28 is coupled through a first RF amplifier where the signal is amplified and gain added to it. It is then coupled to a mixer 32 which is driven by an oscillator 34. The difference frequency signal between the oscillator frequency and the RF amplifier frequency was an intermediate frequency (IF) and was coupled into in IF amplifier 36 for the amplification. The RF stage 30 and the IF stage 36 did not adversely influence each other because they were operated at totally different frequencies. This output signal from the IF amplifier 36 was then coupled to detector 38, audio amplifier 40 and the audio output device 42 such as a speaker or earphones. This circuit has known as a single conversion superheterodyne receiver. If more gain was to be added, second and even third conversion stages with mixers were added to further reduce the signal to different lower frequencies such that each stage was operating at a different frequency and one stage would not adversely influence another stage. In addition, common circuit connections, such as power supply lings coupled the RF signals from one stage to another (conduction) and filtering devices were inserted in the lines connecting stages to each other to reduce the amount of such conduction coupling between stages.

Figure 4:
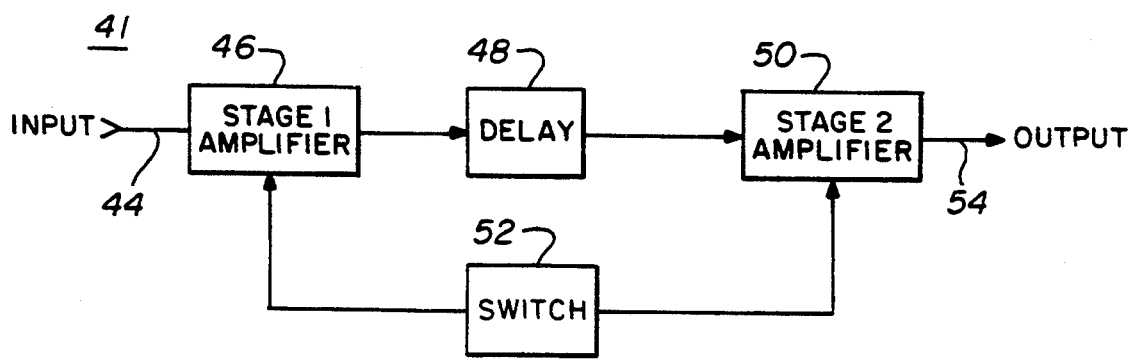
FIG. 4 is a general block diagram of the present invention.
Figure 5:
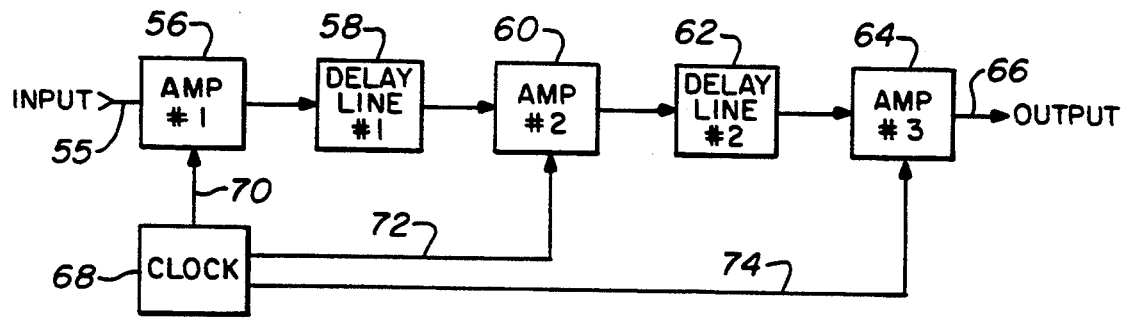
FIG. 5 is a diagram of m amplifier stages coupled by m−1 delay lines and driven by a clock.

Referring to the drawings and more particularly to FIGS. 4 and 5 there may be seen the block diagram of the sequential amplifier of the present invention. The sequential amplifier 41 consists of at least two stages, 46 and 50. A delay device 48 is placed between the amplifier stages 26 and 50 and a switch 52 is used to control adjacent amplifier stages sequentially. A delay line may be constructed from a variety of well-known devices such as a surface acoustic wave device.

Each amplifier stage may be similar in design and construction. However, this is not essential. The requirement for each amplifier stage is that it amplifies or provides gain to an input signal when the stage is energized and the other stage or stages are de-energized.

The switching unit depicted in FIG. 4 will control adjacent amplifier stages so that no two amplifier stages are energized simultaneously. A switch may be constructed from among a variety of well-known devices including clocks or bistable multivibrators.

Figure 8:
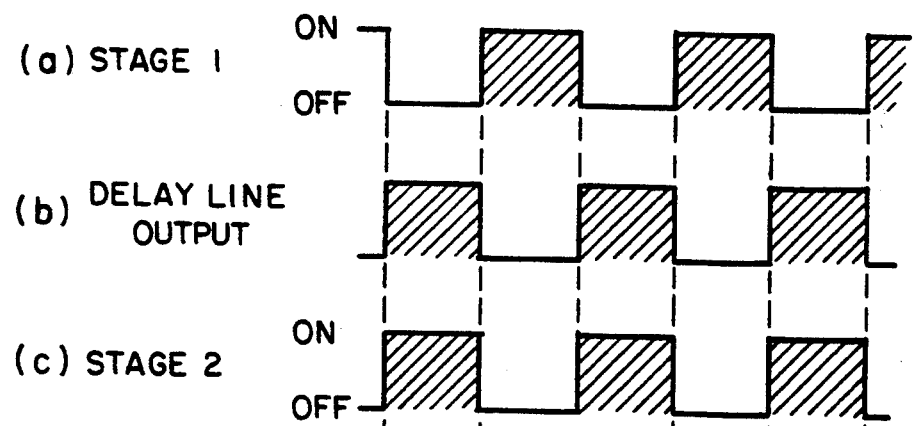
FIG. 8 is a timing chart illustrating the energization timer of the first and second stage amplifiers with respect to the delay time of the delay line.

As can be seen in FIG. 4, an input signal on terminal 44 is coupled to an amplifier 46 which may be considered to be the first stage amplifier. The output signal from the amplifier 46 is coupled to a delay line 48. The output of the delay line 48 is coupled to a second amplifier 50 which may be considered to be the second stage amplifier. The output of the second stage amplifier is coupled to an output terminal 54. The switch 52 operates such that the first stage amplifier 46 is turned ON and the second stage amplifier 50 is turned OFF for a predetermined period of time. Assume, for example only, that the delay 48 has the delay time of one microsecond. The switch 52 may then turn ON the stage 1 amplifier 46 for a predetermined period of time, such as, for example only, one microsecond. Switch 52 then turns OFF the stage 1 amplifier 46 and, as the amplified signal is emerging from the one microsecond delay line 48, switch 52 turns ON the second stage amplifier 50 which again provides an amplification to the RF signal. Thus at no time are the first and second stage amplifiers ON simultaneously. The amount of delay provided by the delay line 48 and the time at which switch 52 turns the first and second stage amplifiers 46 and 50, respectively, ON and OFF may be varied. This timing relationship is illustrated with reference to FIGS. 8 and 9. In FIG. 8(a), the width of the waveform (shown with shading for clarity) indicates the time that the stage 1 amplifier is ON or energized. In waveform (b), the shaded area represents the delay time of the delay line. In waveform (c), the shaded area represents the time of energization of the stage 2 amplifier. Thus it is noted in FIG. 8 that the stage 1 amplifier 46 may be ON for some given period of time, such as one microsecond for example only. The delay line may also have a given delay time, such as one microsecond, as illustrated. Thus, when the amplifier 46 in stage 1 is energized or ON, the output signal is coupled to the delay line and emerges from the delay line after the one-microsecond delay and at that time the stage 1 amplifier is de-energized or turned OFF and the Stage 2 amplifier is energized or turned ON to receive the output signal from the delay line 48.

Figure 9:
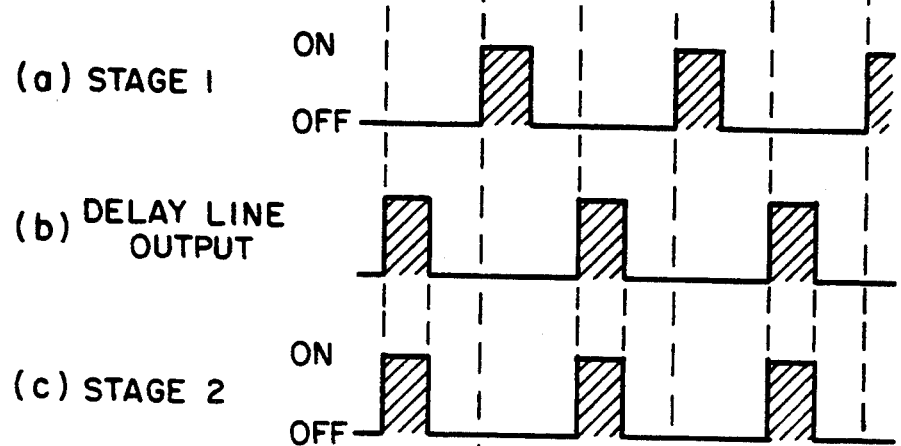
FIG. 9 is a timing chart similar to that shown in FIG. 8 illustrating the timing relationship of the first and second amplifier stages with respect to the delay time of the delay line when the energization time of the amplifiers is less than the delay time of the delay line.
Figure 10:
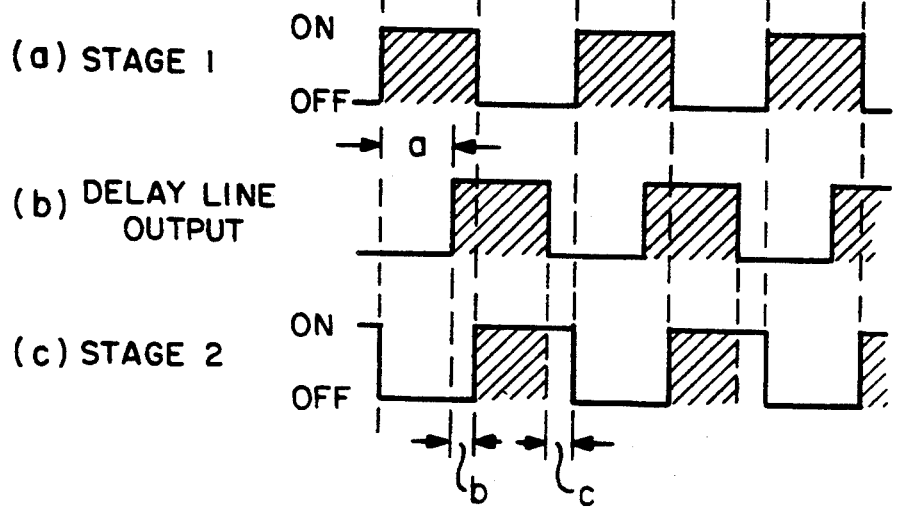
FIG. 10 is a timing chart similar to that shown in FIG. 8 and FIG. 9 illustrating how the timing can be arranged to avoid precision gating of the amplifier stages to their ON and OFF states.

As can be seen in FIG. 9, the time of energization of the stage 1 amplifier as illustrated in waveform (a) may be some fraction of the delay line time, such as one-half microsecond while the delay line may have a larger delay time such as one microsecond as shown in waveform (b). However, when the amplified signal from the first amplifier stage 46 passes through the delay line 48 and emerges therefrom, the second stage amplifier 50 is turned ON and amplifies the output signal. It is noted in FIG. 9 that the stage 1 amplifier 46 is deenergized long before the signal emerges from the delay line. Clearly, the times given are for illustration purposes only. For instance, the width of the illustrated waveforms in (a), (b) and (c) of FIG. 8 could be two microseconds, five microseconds or any other time as desired. In like manner, the waveforms illustrated in FIG. 9 (a), (b) and (c) could be one-quarter microsecond and one-half microsecond respectively, for waveforms (a) and (b). They could be one microsecond and two microsecond for waveforms (a) and (b). In other words, the tinge delay can be selected to meet the needs of a particular situation. For example, the amplifier ON time may be greater than the delay time as shown is FIG. 10 where the amplifier ON time is X and the delay line delay time is ¾X, for purposes of explanation and example only. The signal from the stage 1 amplifier as shown in FIG. 10 (a) exits the delay line ¾X later, the time period shown in FIG. 10(b) by the letter "a", ¼X before stage 2 turns ON as shown in FIG. 10(c) by the letter "b". When all of the stored signal has exited the delay line (FIG. 10(c)), the second stage amplifier is still ON as shown by the letter "c" but no signal is present. The timing then repeats itself. The first amplifier amplifies the signal for a full period, X, while the second amplifier amplifies the signal for a period of ¾X. That portion of the signal exiting the delay line before amplifier 2 is turned ON is lost. The essential requirement is that both of the first and second stage amplifiers 46 and 50 cannot be ON or energized simultaneously. With the circuit 41 operating in this manner, the first amplifier stage 46 can amplify the RF signal to its maximum capability. Although the signal may be radiating and/or being conducted to the second stage amplifier 50, that amplifier is OFF and consequently there are no adverse effects. In like manner, when the second stage amplifier 50 is amplifying the signal to its maximum capability, it is also radiating the RF signal. However, because the first stage amplifier 46 is then turned OFF, there is no adverse effect. Thus maximum gain can be obtained in the RF stages where the gain is most difficult to obtain. It is to be understood, of course, that the circuit 41 shown in FIG. 4 can be used with any desired frequencies from audio to UHF. Even in audio stages, if the amplifier stages are driven sufficiently hard, radiation and/or conduction can occur from one stage to another at audio frequencies. Thus, the circuit can be used with any frequency so long as the amplifier stages are not energized simultaneously.

FIG. 5 is a general representation of a circuit utilizing the present invention and having three stages of gain. As can be seen in FIG. 5, an input signal on line terminal 55 is coupled to an amplifier 56, the first stage amplifier. Its output is coupled to the first delay line 58 and the output of the delay line 58 is coupled to a second amplifier stage 60. The output of the second amplifier stage 60 is coupled to a second delay line 62 that has its output coupled to the third amplifier stage 64. The output terminal 66 is coupled to and receives the output from the third amplifier 64. A clock 68 or a bistable multivibrator 68 may be used to generate timing signals on lines 70, 72 and 74 at any desired interval in a well-known manner. When the clock 68 generates a first signal on line 70, only the first amplifier stage 56 is energized. It amplifies the input signal and couples it to the delay line 58. When the first stage amplifier 56 is shut OFF by the clock pulse line on line 70, the clock generates a second pulse on line 72 which turns the second amplifier stage 60 ON when the signal exits from the delay time of delay line 58. Of course, the gating may be such that second amplifier stage 60 is turned ON before, or after, the signal exits from delay line 58 as explained previously. The second amplifier stage 60 then receives the delayed amplified signal from the delay line 58 and amplifies it. Clock 68 then removes the signal from line 72 and deenergizes amplifier 60. Clock 68 then provides the clock signal on line 74 that energizes amplifier 64, the third stage amplifier. It receives the amplified output from delay line 62 and generates the output on line 66. Thus three stages of amplification are provided in FIG. 5. Again, it will be noted that only one of the amplifiers 56, 60 and 64 is energized at any one time. Thus while each of the amplifiers 56, 60 and 64 is radiating signals when it is energized, the radiations are not a detrimental influence on the remainder of the system because any two of the amplifiers are de-energized during the time the third amplifier is energized and thus the de-energized amplifiers do not accept the radiated signals.

Figure 6:
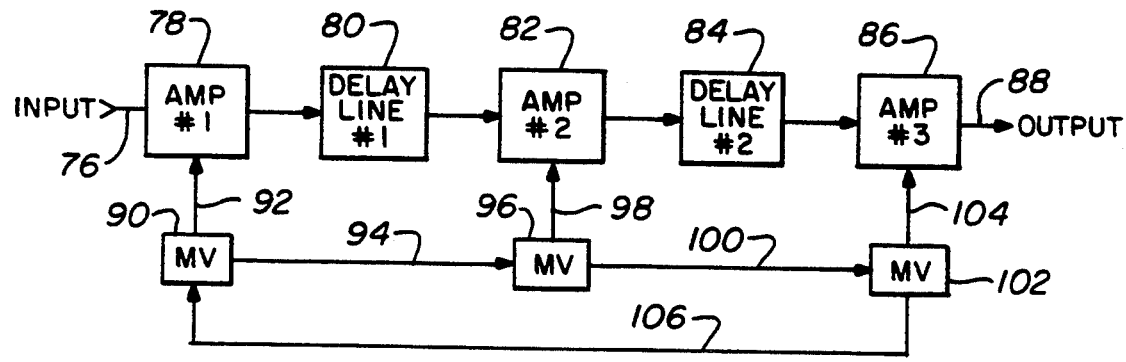
FIG. 6 is a diagram of m amplifier stages coupled by m−1 delay lines and driven by m monostable multivibrators.

FIG. 6 is a circuit similar to that in FIG. 5 except that a monostable multivibrator 90 is used to energize the first amplifier 78 for a predetermined period of time with an enabling pulse on line 92. When the enabling pulse on line 92 decays, the amplifier 78 is de-energized and the trailing edge of the pulse on line 94 then energizes multivibrator 96. Again, an enabling pulse is produced on line 98 to energize the second stage amplifier 82 for a predetermined period of time. When the pulse on line 98 is removed, the trailing edge of the pulse causes a signal on line 100 that energizes the third multivibrator 102. Again, an enabling pulse is generated on line 104 that energizes amplifier 86, the third stage amplifier. At the time when the third stage amplifier 86 is de-energized, the trailing edge of the pulse from multivibrator 102 on line 106 energizes the first multivibrator 90 and the cycle repeats itself. Clearly there may be other arrangements that could be used, but in any case the limiting factor is that only one of the three amplifiers in FIGS. 5 and 6 may be energized at any one moment in time.

Figure 7:
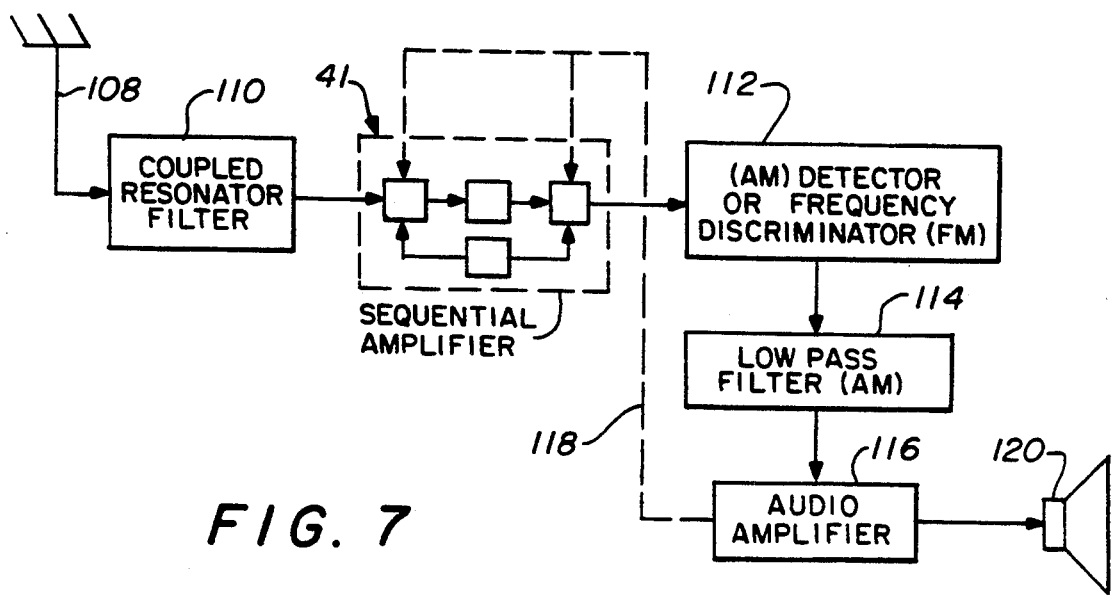
FIG. 7 is a block diagram of the present invention in a typical radio receiver application.

A typical application of the sequential amplifier is shown in FIG. 7. Here the sequential amplifier 41 is included in a receiver such as a radio receiver or a TV receiver. The antenna 108 receives a modulated radio frequency signal that is coupled to and filtered by a tunable or nontunable filter such as a coupled resonator filter 110 to select and isolate the modulated RF signal. The sequential amplifier 41 is shown in phantom lines, and is a duplicate of the circuit of FIG. 4. It will amplify the selected input RF signal as previously described. The amplified RF signal will then pass through the detector 112 that, in combination with device 114, will detect and demodulate the signal. The device 112 may be a frequency discriminator for FM signals or an AM detector for AM signals. The low pass filter 114 removes the enabling or switching pulses as well as the RF carrier as is well known by those skilled in the art. The detected signal will essentially be the audio component of the received radio signal. The detected signal will then pass through an audio amplifier 116 and then into the audio output device 120. The output power of the sequential amplifier may be adjusted by means of an automatic gain control (AGC) 118 for AM circuits as desired.

One skilled in the art will recognize that the alternate energization of the amplifiers is a form of sampling of the input signal. It will be understood that the sampling rate can be greater than or less than the modulation signal frequency. Thus with a high sampling rate there would be a large number of samples per cycle of the modulation signal. With a low sampling rate, there would be a large number of modulation cycles per sample.

Thus, there has been disclosed a novel sequential amplifier that can be used to amplify electronic signals of any type where radiation or coupling of the signals from one stage by other means could cause feedback to a previous stage and thus limit the amount of stable amplification that can be achieved.

As can be seen from the above description, the sequential amplifier is ideally suited for use in radio receivers. Note, however, that this type of circuit has many applications. It could be used to amplify signals in a transmitter, for instance. This circuit may be employed almost anywhere electronic signal amplification is needed.

The circuit can be used with signals such as AM, FM, PPM, PCM, FSK, digital signals, analog signals and other like signals that need to be amplified.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A sequential amplifier comprising:
   m amplifier stages for amplifying an input signal, where m is $\geq$ than 3, said m amplifier stages becoming unstable when any two of said m amplifier stages are energized simultaneously;
   m−1 delay lines, each delay line coupling two successive amplifier stages respectively of the m amplifier stages for causing a predetermined time delay before an amplified input signal from one of the m amplifier stages is coupled to the succeeding one of the m amplifier stages; and
   a switching circuit for stabilizing said m amplifier stages by sequentially energizing each of the m amplifier stages such that only one of the m amplifier stages is energized at any one time so as to prevent feedback signals being coupled from one amplifier stage to another.

2. A sequential amplifier as in claim 1 wherein the switching circuit comprises a bistable multivibrator having m alternately stable output voltages, each of said m voltages being coupled to a corresponding amplifier stage such that only one of the m amplifier stages is energized at any given time so as to prevent radiated feedback signals from one amplifier stage being coupled to another amplifier stage.

3. A sequential amplifier as in claim 1 wherein the switching circuit comprises:
   a clock for generating m output signals, a first one of the m output signals energizing only a first one of the m amplifier stages;
   a second one of the m output signals energizing only a second one of the m amplifier stages; and
   an mth one of the m output signal energizing only an mth one of the m amplifier stages such that at any one time only one of the m amplifier stages is energized so as to prevent radiated and physically conducted feedback signals from one amplifier stage being coupled to another amplifier stage.

4. A sequential amplifier as in claim 1 wherein the switching circuit comprises m monostable multivibrators, each of the m multivibrators having an output pulse coupled to both a corresponding one of the m amplifier stages for energizing the amplifier stage and to a successive one of the monostable multivibrators such that a trailing edge of the output pulse of each multivibrator energizes the succeeding multivibrator and an output of the mth multivibrator energizes the first multivibrator whereby only one of the m amplifier stages is energized at any one time so as to prevent radiated feedback signals from one amplifier stage being coupled to another.

5. A method of sequentially amplifying an electronic signal comprising the steps of:
   coupling the electronic signal to a first one of m successive amplifier stages for amplification, where m is $\geq$ than ', said m successive amplifier stages becoming unstable when any two of them are in an energized state simultaneously;
   coupling each two successive ones of the m amplifier stages with one of m−1 delay lines to cause a predetermined time delay before an amplified electronic signal from one amplifier stage is coupled to a succeeding amplifier stage; and
   stabilizing said m successive amplifier stages by sequentially energizing each of the m amplifier stages such that only one of the m amplifier stages is in an energized state at any one time so as to prevent feedback signals from one of the m amplifier stages being received by another one of the m amplifier stages.

6. An RF signal receiver comprising:
   signal receiving means for receiving modulated RF frequency signals;
   a frequency tunable device coupled to the signal receiving means for selecting a predetermined frequency signal from the modulated RF frequency signals;
   a sequential amplifier coupled to the tunable device for amplifying the selected RF frequency signal, the sequential amplifier comprising:
   at least two amplifier stages that become unstable when directly coupled to each other for amplifying an input signal at the predetermined frequency and generating a signal at the output;
   a delay device coupling a preceding one of the amplifier stages to a succeeding one of the amplifier stages for causing a predetermined time delay before an amplified input signal from the preceding amplifier stage is coupled to the succeeding one of the amplifier stages; and
   a switching unit for preventing instability of the at least two amplifier Stages from occurring by energizing only a preselected one of said at least two amplifier stages at any given time such that when said preselected one of the at least two amplifier stages amplifies the input signal, the another one of the at least two amplifier stages is de-energized thereby enabling maximum gain of the input signal to be obtained from each amplifier stage without signal feedback interfering with the remaining amplifier stages;
   a detector coupled to the sequential amplifier for demodulating the output signal;
   a filter coupled to the detector for removing unwanted signals; and
   an output amplifier for amplifying demodulated output signal.

7. A receiver as in claim 6 wherein the demodulated output signal is an analog data signal.

8. A receiver as in claim 6 wherein the demodulated output signal is a digital data signal.

9. A receiver as in claim 7 wherein the analog data signal is an audio signal.

* * * * *

UNITED STATES PATENT AND TRADEMARK OFFICE
CERTIFICATE OF CORRECTION

PATENT NO. : 5,357,206

DATED : October 18, 1994

INVENTOR(S) : Darrell L. Ash

It is certified that error appears in the above-indentified patent and that said Letters Patent is hereby corrected as shown below:

```
Column 1, line 34, "radiossuffered" should read -- radio
    suffered --.
Column 3, line 18, "conductions" should read -- conducting --.
Column 4, line 45, "has" should read -- was --.
Column 4, line 52, "lings" should read -- lines --.
Column 4, line 62, "26" should be -- 46 --.
Column 5, line 47, "Stage" should read -- stage --.
Column 5, line 59, "deenergized" should be -- de-energized --.
Column 5, line 67, after "second" and before "respectively",
    insert -- . --.
Column 5, line 68, "two microsecond" should read -- two
    microseconds --.
Column 6, line 1, "tinge" should read -- time --.
Column 6, line 50, delete "68".
Column 6, line 66, "deenergizes" should read -- de-energizes --.
Column 8, line 31, "the" should read -- a --.
```

UNITED STATES PATENT AND TRADEMARK OFFICE
CERTIFICATE OF CORRECTION

PATENT NO. : 5,357,206
DATED : October 18, 1994
INVENTOR(S) : Darrell L. Ash

It is certified that error appears in the above-indentified patent and that said Letters Patent is hereby corrected as shown below:

```
Column 8, line 54, "signal" should read -- signals --.
Column 9, line 9, " ', " should read -- 3, --.
Column 10, lines 4-14, should read as follows:
    -- a delay device coupling a preceding one of the amplifier
         stages to a succeeding one of the amplifier stages
         for causing a predetermined time delay before an
         amplified input signal from the preceding amplifier
         stage is coupled to the succeeding one of the
         amplifier stages; and
      a switching unit for preventing instability of the
         at least two amplifier stages from occurring
         by energizing --
Column 10, line 18, delete "the", second occurrence.
Column 10, line 28, after "amplifying" and before "demodulated",
    insert -- the --.
```

Signed and Sealed this

Fourteenth Day of March, 1995

Attest:

BRUCE LEHMAN

Attesting Officer    Commissioner of Patents and Trademarks